United States Patent [19]

Sugawa

[11] Patent Number: 5,744,849
[45] Date of Patent: Apr. 28, 1998

[54] PHOTOELECTRIC CONVERTING DEVICE AND IMAGE PROCESSING APPARATUS USING THE SAME

[75] Inventor: Shigetoshi Sugawa, Atsugi, Japan

[73] Assignee: Canon Kabushiki Kaisha, Tokyo, Japan

[21] Appl. No.: 279,870

[22] Filed: Jul. 26, 1994

Related U.S. Application Data

[63] Continuation of Ser. No. 818,887, Jan. 10, 1992, abandoned.

[30] Foreign Application Priority Data

Jan. 11, 1991 [JP] Japan ................... 3-012593
Jan. 14, 1991 [JP] Japan ................... 3-016008

[51] Int. Cl.$^6$ .......................................... H01L 31/107
[52] U.S. Cl. .......................... 257/438; 257/53; 257/55
[58] Field of Search ............................ 257/53, 438, 55, 257/439

[56] References Cited

U.S. PATENT DOCUMENTS

| | | | |
|---|---|---|---|
| 4,409,134 | 10/1983 | Yamazaki | 252/501.1 |
| 4,508,609 | 4/1985 | Moustakas et al. | 257/56 |
| 4,962,412 | 10/1990 | Shinohara et al. | 357/30 |
| 5,101,255 | 3/1992 | Ishioka et al. | 257/52 |
| 5,155,351 | 10/1992 | Yamanobe et al. | 257/435 |

FOREIGN PATENT DOCUMENTS

| | | |
|---|---|---|
| 87299 | 8/1983 | European Pat. Off. . |
| 437633 | 7/1991 | European Pat. Off. . |

OTHER PUBLICATIONS

IEEE Trans. Elec. Dev., vol. 35, No. 8, Aug. 1988, pp. 1279–1283, S.C. Jwo, et al. "Amorphous Si/SiC Superlattice Avalanche Photodiodes".

Elec. Letters, vol. 16, No. 12, 5 Jun. 1980, pp. 467–469, Chin, et al., "Impact Ionisation in Multilayered Hetero Junction Structures".

Patent Abstracts of Japan, vol. 14, No. 187 (E–917) Apr. 16, 1990.

Patent Abstracts of Japan, vol.13, No.34 (E–708) Jan. 25, 1989.

Sealy, D.J. "Review of III–V Semiconductor Materials and Devices", J. Inst. of Electronic & Radio Engineers –Supplements, vol. 57, No. 1–Su, Jan. 1987.

Pearsall, "ZAP! Introducing the Zero–Bias Avalanche Photodiode", Electronics Letters, vol. 18, No. 2, Jun. 10, 1982.

McIntyre, "Multiplication Noise in Uniform Avalanche Diodes", IEEE Tran. on Elec. Dev., vol. 13, No. 1, Jan. 1966.

Williams, et al., "The Graded Bandgap Multilayer Avalanche Photodiode: A New Low–Noise Detector", vol. EDL–3, No. 3, Mar. 1982.

*Primary Examiner*—Jerome Jackson
*Assistant Examiner*—John Guay
*Attorney, Agent, or Firm*—Fitzpatrick, Cella, Harper & Scinto

[57] ABSTRACT

A photoelectric converting device has a photoelectric converting part which consists of a light absorbing layer of a predetermined forbidden band width $Eg1$ and a carrier multiplying layer, positioned in laminate structure between charge injection blocking layers. The multiplying layer is composed of a layer or plural layers with a stepback structure of the forbidden band width having a minimum width $Eg2$ and a maximum width $Eg3$ in alternate manner and showing a continuous variation therebetween in each layer. The charge injection blocking layers, light absorbing layer and carrier multiplying layer are composed of non-monocrystalline semiconductors and at least having the minimum forbidden band width $Eg2$ and/or the maximum forbidden band width $Eg3$ contain a microcrystalline structure.

20 Claims, 7 Drawing Sheets

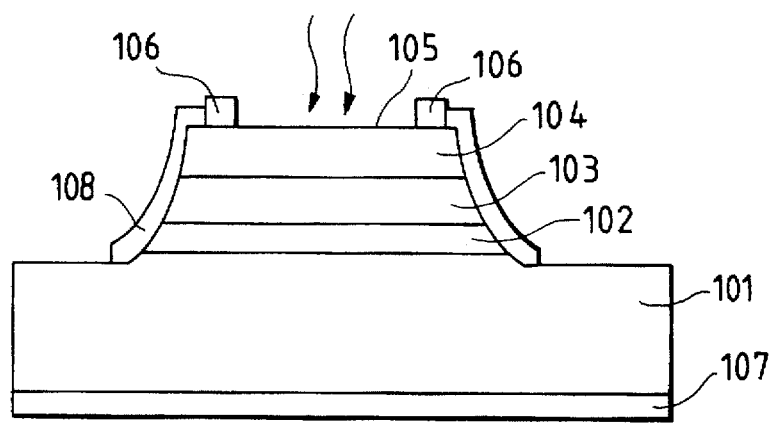
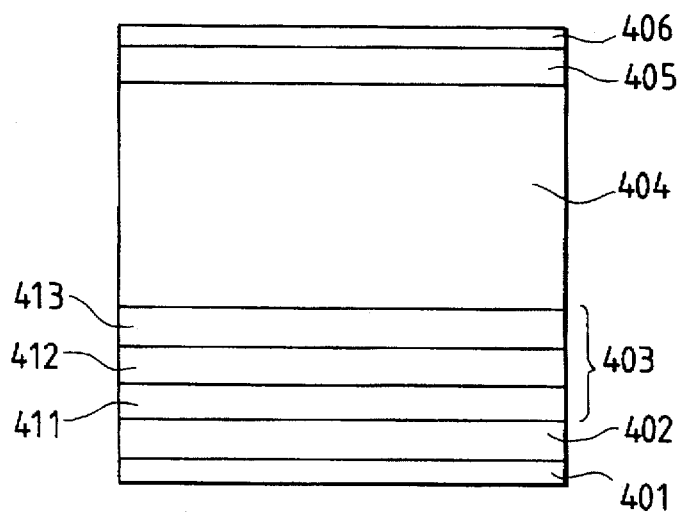

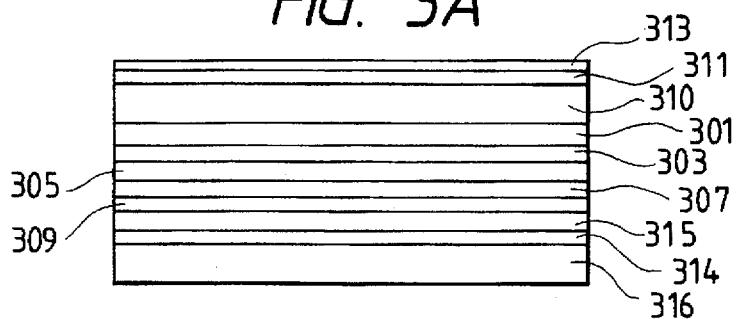
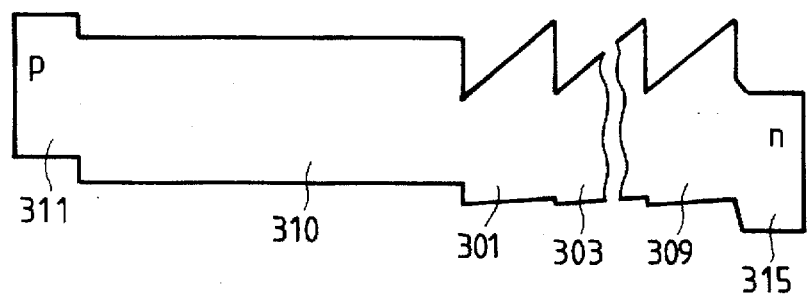
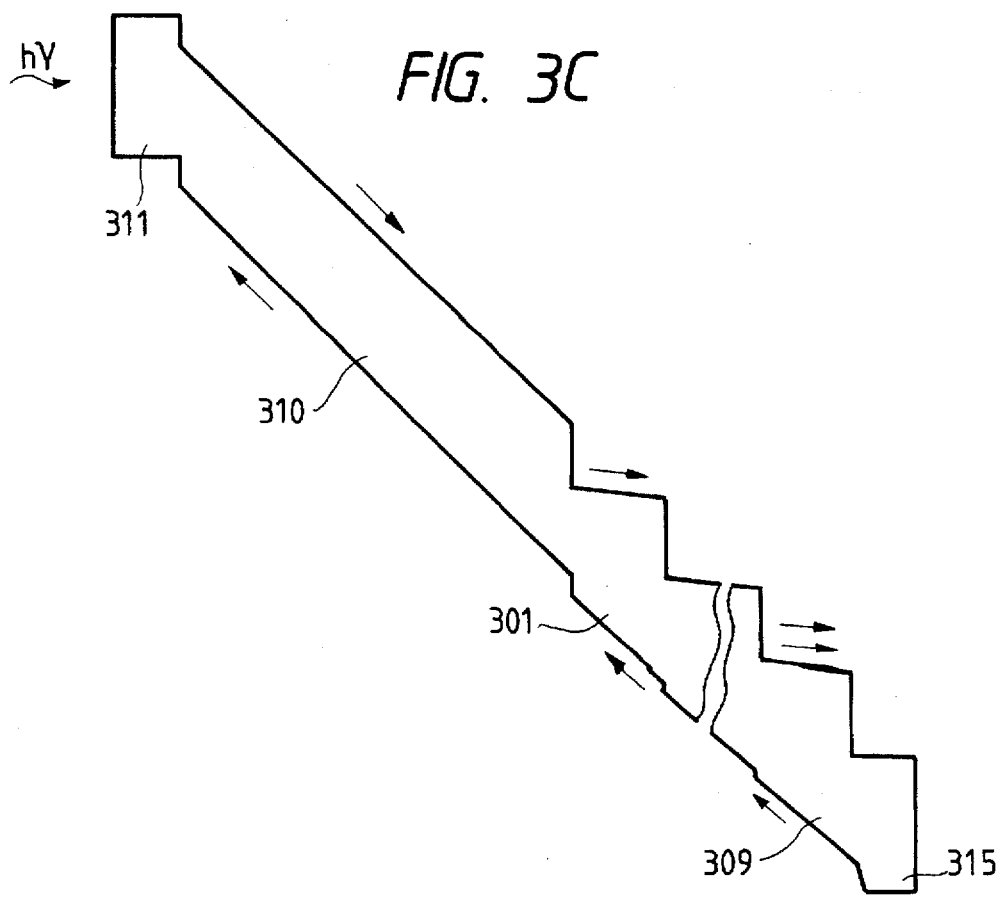

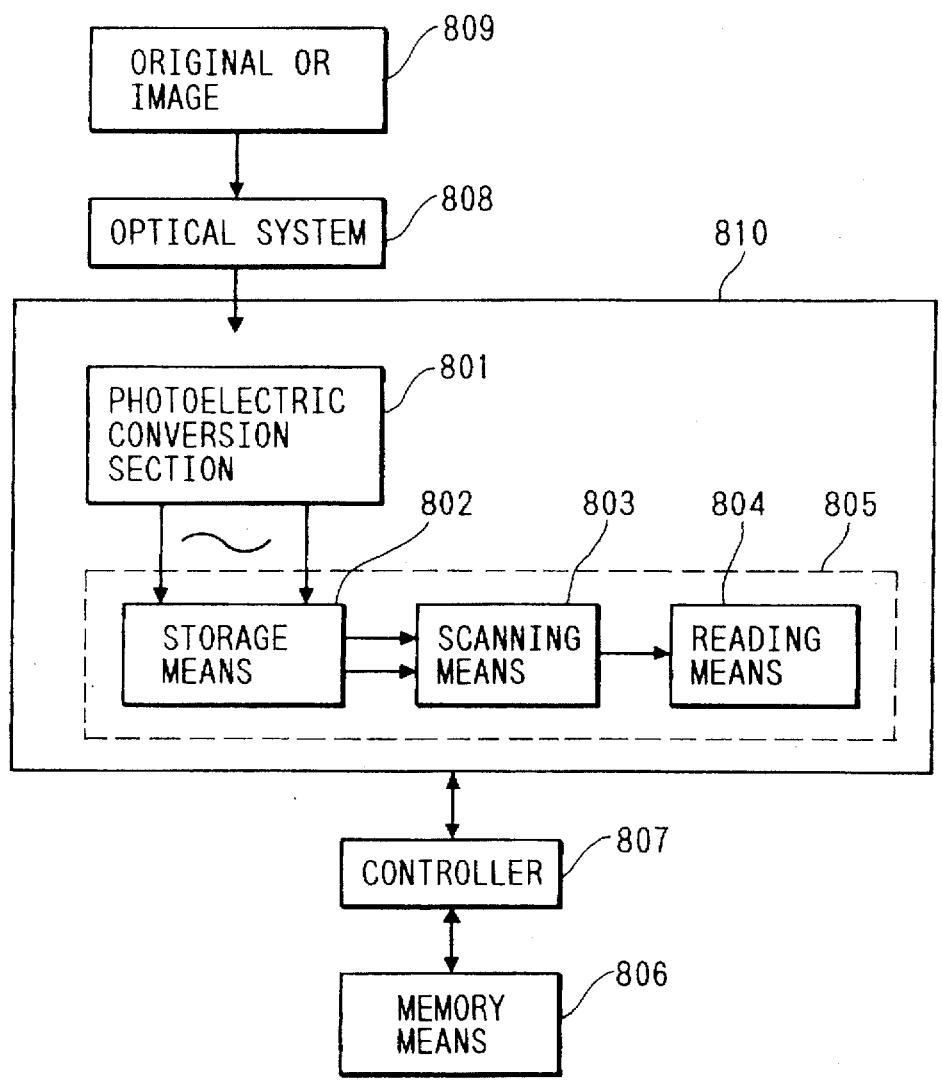

PHOTOELECTRIC CONVERTING DEVICE AND IMAGE PROCESSING APPARATUS USING THE SAME

This application is a continuation of application Ser. No. 07/818,887 filed Jan. 10, 1992, now abandoned.

BACKGROUND OF THE INVENTION

1. Field of the Invention

The present invention relates to a photoelectric converting device and an image processing apparatus utilizing the same, and more particularly to a photoelectric converting device utilizing an avalanche effect for amplifying carriers, generated in a light absorbing layer, by collision ionization, and an image processing apparatus utilizing such photoelectric converting device.

2. Related Background Art

Such a photoelectric converting device, provided with a semiconductor photosensor for converting an optical signal into an electrical signal, is adapted for use for example as a light metering sensor for a camera, an image reader in a facsimile apparatus or a copying machine, or a photosensor in an optical communication apparatus, and is already commercialized in various forms.

Such semiconductor photosensor is generally required to have a high signal-to-noise (S/N) ratio for the photoelectric conversion, and an avalanche photodiode utilizing the avalanche effect (hereinafter called APD) is considered as a promising candidate for meeting such requirement, because of a high gain and a high response speed thereof.

Such APD, already commercialized with compound semiconductors such as InGaAs principally as a semiconductive photosensor in the optical communication systems, is being subjected to various active developmental works for improving the basic device characteristics such as noise level, response and gain. Application to other fields, for example as a photosensor for visible light, are also expected.

FIG. 1 schematically illustrates an example of such APD for optical communication, consisting of semiconductors 101–108 of laminate structure, including an $n^+$-InP layer 101; an n-InGaAs layer 102; an n-InP layer 103; and a $p^+$-InP layer 104, of which the layers 102, 103 and 104 are formed in a mesa structure. On the $p^+$-InP layer 104, there is formed a p-electrode 106, leaving a window 105 therein. On the bottom side of the $n^+$-InP layer 101, there is formed an n-electrode 107. Also there is provided a passivation film 108. When light irradiates the window 105, with an inverse bias between the p-electrode 106 and the n-electrode 107, the n-InGaAs layer (light-absorbing layer) 102 absorbs the light and effects photoelectric conversion. The electrons and positive holes generated in said layer 102 respectively move to the n-electrode 107 and the p-electrode 106. As the n-InP layer 103 (multiplying layer) has a strong electric field therein, an avalanche phenomenon appears to generate plural electron-hole pairs in the course of movement of positive holes, thereby realizing a multiplying effect for forming plural electron-hole pairs for a single photon. Therefore, the above-explained semiconductor device is capable of detecting even very weak light, when used as a photosensor.

However, in the conventional structure explained above, the practical multiplication in the multiplying layer is as small as about 2 times, and the fluctuation involved in the multiplying process may generate noises by excessive multiplication, thus deteriorating the signal-to-noise ratio.

The noises generated in the avalanche multiplying process are known to be strongly dependent on a ratio $k = \beta/\alpha$ of ionization rate $\beta$ of electrons to ionization rate $\alpha$, as reported, for example, by R. J. McIntyre, IEEE Transactions on Electron Devices, 13th Edit. (Jan. 1966), pp. 164–168.

The ionization rate of electrons means the rate of formation of an electron-hole pair by collision ionization when the electron is accelerated by an electric field. Also the ionization rate of positive holes means the rate of collision ionization of positive holes. Also the above-mentioned report suggests decreasing the value of k for electron multiplication and increasing said value for positive hole multiplication, for obtaining an APD of low noise level. It is thus important, for obtaining a high S/N ratio in an APD, to employ a material showing significantly different ionization rates for the carriers (electrons and positive holes) and to effect the avalanche multiplication only on the carriers of the higher ionization rate. Also said report indicates an excessive noise index F of "2" as the limit of noise reduction achievable by the avalanche multiplication of carriers only.

Since the index F should become equal to "1" in the ideal case without any noise, the limit F=2 suggests the presence of a noise-generating mechanism. Said mechanism may be based on a phenomenon that the location of individual ionization, constituting the base process of avalanche multiplication, shows fluctuation, and such fluctuation is integrated to result in a fluctuation in the multiplying rate.

In consideration of the foregoing, an avalanche multiplication without noise generation requires limiting the location of the ionization within the device, and specifying the probability of ionization in such limited location of ionization. Besides, in order to achieve an avalanche multiplication of a high gain, it is important to bring said probability of ionization as close as possible to unity.

In consideration of the aforementioned two drawbacks of low multiplication level and loss in S/N ratio, F. Capasso et al. proposed, for example in the Japanese Patent Laid-Open Application No. 58-157179 and IEEE Electron Device Letters, EDL 3rd Edit. (1982), pp. 71–73, an APD of low noise level, usable in an optical communication system, prepared with a compound semiconductor principally of groups III–V of the periodic table, for example utilizing molecular beam epitaxy (MBE).

The above-mentioned device is featured by a multi-layered hetero junction structure, consisting of plural semiconductor layers in which the band gap is widened in succession by varying the composition ratio of the constituents (in case of a III–V compound semiconductor, the ratio of the semiconductor of group III to that of group V) and thus formed stepwise transition parts of the energy bands (hereinafter referred to as stepback structure) are utilized for promoting the ionization.

The structure and function of the above-mentioned device will be briefly explained with reference to FIGS. 2A to 2C. In the illustrated structure, five layers 201, 203, 205, 207 and 209 constituting multiplying layers of a stepback structure are sandwiched between a p-semiconductor layer 211 serving as a light absorbing layer and an n-semiconductor layer 215, and electrodes 213, 214 are in respective ohmic contact with said layers 211 and 215.

FIG. 2B shows a part of the energy band structure, with band gap inclined layers, under the absence of biasing in said device. In each layer, the band gap is linearly varied from a narrow band gap (minimum forbidden band) Eg2 to a wide band gap (maximum forbidden band) Eg3.

The magnitudes of stepback of the conduction band and the valence electron band are respectively indicated by ΔEc and ΔEv. ΔEc is selected larger than ΔEv for principally facilitating the ionization of electrons, as will be explained later.

FIG. 2C shows the energy band structure when an inverse bias voltage is applied to said device. The electric field generated by said bias voltage need not be stronger than that in the APD shown in FIG. 1.

When the light enters the p-semiconductor layer 211, it is absorbed in said layer and the layers of the stepback structure to effect photoelectric conversion as in the aforementioned APD, and the generated electrons and positive holes respectively move toward the n-semiconductor layer 215 and the p-semiconductor layer 211. However, different from the APD shown in FIG. 1, if the energy step $\Delta Ec$ (for electrons; or $\Delta Ev$ for positive holes) becomes larger than the ionizing energy, the electron is ionized to generate an electron-hole pair, thus generating a multiplying effect. As each of the layers of the stepback structure functions in a similar manner, there is obtained a multiplication of $2^n$ for n layers. The noise level can be made lower than in the aforementioned APD shown in FIG. 1, since the ionization rate of the positive holes can be made much lower than that of the electrons for ideally selecting a condition $\Delta Ec \gg \Delta Ev \approx 0$.

More specifically, the bias voltage is so applied to generate an electric field, called drift field, that causes depletion in the layers 201, 203, 205, 207 and 209 of stepback structure and induces the drift of carriers but not the ionization thereof in said layers. The light hν is absorbed in a depletion area next to the p-semiconductor layer 211, namely in the inclined band gap layer 203 to generate an electron in the conduction band and a positive hole in the valence electron band. The generated electron drifts in said layer 203, toward the stepback of the first conduction band. Since said stepback has an energy difference $\Delta Ec$ that can be replenished to the electron for the ionization energy, the electron has a higher probability of causing ionization immediately after said stepback. The probability of ionization after said stepback can therefore be brought sufficiently close to unity, if said $\Delta Ec$ is equal to or larger than the ionization energy of electron, or, even in case it is smaller than said ionization energy, if the deficient energy can be supplied from the drift electric field. Upon ionization, one electron becomes two electrons and a positive hole. Said two electrons drift toward the second stepback in the inclined band gap layer 203, and cause a similar phenomenon as explained above at said second stepback. On the other hand, the positive hole generated in the layer 203 drifts in a direction opposite to that of the electron, and reaches the first stepback. If the valence electron band of said first stepback already has an energy difference Ev of a magnitude not inducing the ionization of the positive hole, the positive hole continues to drift in the same direction. If the stepback has a positive energy difference, seen from the positive hole, as shown in FIG. 2C, the positive hole is scattered or accumulated at said stepback but not ionized. Thus the number of carriers is multiplied by the drift and ionization of electrons and the drift of positive holes, repeated in the inclined band gap layers and in the stepbacks. Finally, the electrons multiplied by ionization reach the n-semiconductor layer and are taken out as an electron current from an electrode in ohmic contact with said n-conductor layer, while the positive holes reach the p-semiconductor layer and are taken out as a hole current from an electrode in ohmic contact with said p-semiconductor layer.

The low-noise APD explained above realizes the aforementioned concepts of limiting the location of ionization and bringing the probability of ionization infinitely close to unity, by a multi-layered heterogeneous junction structure consisting of plural semiconductor layers in each of which the energy gap is continuously varied from a narrow gap to a wide one by a change in the composition of the constituent materials, and capable of promoting the ionization utilizing the stepbacks formed in such multi-layered structure.

Although such device structure explained above constitutes a theoretical approach for realizing a low-noise APD, it is subject to various limitations in the actual preparation. At first, for obtaining a device with such stepback structure as to promote the ionization merely by the variation in the ratio of composition of the constituent materials, the usable materials and methods of preparation become inevitably limited. Examples of such materials include, in the range of III-V compound semiconductors, AlGaAsSb/GaSb grown on a GaSb substrate, InGaAlAs/InGaAs grown on an InP substrate, and InGaAsSb/GaSb grown on a GaSb substrate, and, in the range of II-VI compound semiconductors, HgCdTe grown on a lattice aligned substrate.

However, these elements such as Ga, As, Hg, Cd etc. are not preferable for industrial use, as they are strongly toxic, relatively rare and expensive.

Besides the molecular beam epitaxy (MBE) employed for preparing these devices is unsuitable for the preparation of a large-area device and for mass production, as it requires ultra high vacuum and is associated with a very low growth speed. Also since the typical growth temperature of semiconductors by MBE requires a temperature as high as 500°–650° C., preparation of a photosensor on a semiconductor device already including an integrated circuit may cause damage to such integrated circuit.

Furthermore, in order to prepare such low-noise APD, the ratio of composition of such materials has to be varied so as to ensure the ionization at the stepback, and said ratio has to be determined in consideration of the lattice alignment at generation, a trap level at the heterogeneous interface, and of the electron affinity sufficient for generating an energy difference comparable to the ionization energy at the stepback. For this reason, the actually realizable band gap becomes inevitably limited.

For example, in the aligned lattice structure with the first-mentioned materials, it is experimentally confirmed that the narrowest band gap is 0.73 eV provided by GaSb while the widest band gap is 1.58 eV provided by $Al_{1.0}Ga_{0.0}As_{0.08}Sb_{0.92}$. Thus the maximum band gap difference is 0.72 eV at the conduction band side, while 0.13 eV at the valence electron band side, and the ionization energy of electron is 0.80 eV (GaSb). The deficiency, 0.08 eV, for the ionization of electron at the stepback, is to be supplied from the drift electric field. The device prepared with such materials is incapable of achieving a low noise level, since the noise component is increased by a leak (dark) current which tends to be generated in the absence of light irradiation. Such dark current is generated, for example, by carriers injected from the external electrodes in ohmic contact, or by carriers thermally generated in the device through defect levels or heterogeneous interface levels. In such device, the effect of blocking the injected carriers is achieved by the presence of the p- and n-semiconductor layers, but is insufficient because enough consideration is not given to these layers. Also the amount of thermally generated carriers, though dependent on the density of defect levels and of interface levels, is fundamentally dependent on the magnitude of the band gap, and is known to decrease as the band gap increases. The above-explained device is associated with a drawback that the minimum band gap is too narrow for suppressing the thermally generated carriers. Moreover, the device with such band gap is inevitably limited in its application, because it is only suitable for receiving the light in a spectral range from 1.0 to 1.6 μm, but is not suitable for other spectral regions, for example the visible region.

The second-mentioned combination of materials is not promising, because the energy difference of the conduction band at the stepback is as small ca. 0.6 eV, though the ionization energy is as large as ca. 1 eV.

Other materials mentioned above have similar defects as in the first-mentioned ones. Particularly on the last-mentioned combination of materials, T. P. Pearsall proposed, in Electronics Letters, Vol. 18, No. 12 (June 1982), pp. 512–514, a device with a minimum band gap of 0.5 eV and a maximum band gap of 1.3 eV by varying the ratio of Hg and Cd, but such device is associated with a very small minimum band gap and is easily affected by thermal dark current.

In consideration of the foregoing, in order to effectively realize a low-noise APD with a structure for increasing the ratio of the ionization rates of the carriers, it will be apparent that one should take into consideration the materials employed, freedom of selection of the method of preparation, suppression of dark current, and band structure providing a wide photosensitive spectral range.

More specifically, the technical issues to be resolved on the performance of the conventional APD mentioned above and those on the preparation of such APD can be summarized as follows.

The technical issues related to the performance of the APD are as follows:

(1) The APD prepared with the above-mentioned materials is unsuitable as an image reading device since the amplification rate varies according to the wavelength of the incident light when the incident wavelength is variable in a wide range such as the visible spectral range, as the incident light is absorbed in the p-semiconductor layer and in the multiplying layer;

(2) The APD prepared with the above-mentioned materials is associated with a high dark current and a high noise level because the forbidden band which is small in the light absorbing layer and in the multiplying layer; and (3) The APD prepared with the above-mentioned materials, designed originally for optical communication, can only be used in a spectral range of ca. 800–1600 nm, and cannot be used in other spectral ranges such as visible spectral range.

Also the technical issues related to the preparation of device are as follows:

(1) The above-explained APD, employing a stepback structure with a compound semiconductor, has a limitation in noise reduction, because the composition of the compound semiconductor is difficult to vary and the magnitudes of ΔEc and ΔEv are limited;

(2) The above-explained APD, based on compound semiconductors of III-V or II-VI groups of the periodic table, are associated with the toxicity, cost etc. of the materials to be employed; and (3) The method of preparation of such compound semiconductor is not suitable for the preparation of an image reading device, as it requires ultra high vacuum and a high temperature of ca. 500°–650° C. for film formation, and is scarcely capable of providing a large-area device.

SUMMARY OF THE INVENTION

In consideration of the foregoing, an object of the present invention is to provide a photoelectric converting device of a novel structure, which is no longer associated with the technical drawbacks of the prior art, and is featured by a fast response, in particular a low noise level and a high sensitivity in the photoelectric conversion in the visible spectral region, and easy preparation of a large-area device.

Another object of the present invention is to provide a photoelectric converting device having a wide photosensitive spectral range with a reduced dark current, and particularly excellent characteristics in the visible spectral range.

Still another object of the present invention is to provide a photoelectric converting device capable of efficiently ionizing the carriers, thereby realizing an effective multiplication effect.

BRIEF DESCRIPTION OF THE DRAWINGS

FIG. 3A is a schematic cross-sectional view of an embodiment of the photoelectric converting device of the present invention;

FIG. 3B is an energy band chart of said device in an unbiased state;

FIG. 3C is an energy band chart of said device in a biased state for carrier multiplication;

FIG. 7 is a block diagram of an image processing apparatus embodying the present invention.

DETAILED DESCRIPTION OF THE PREFERRED EMBODIMENTS

Figure 2A:
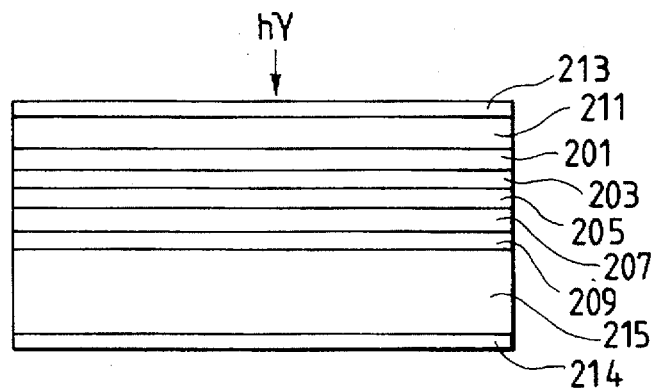
FIG. 2A is a vertical cross-sectional view of an APD for optical communication with a stepback structure.
Figure 2B:
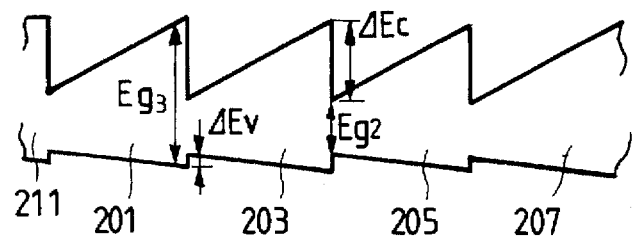
FIG. 2B is an energy band chart of said APD in unbiased state
Figure 2C:
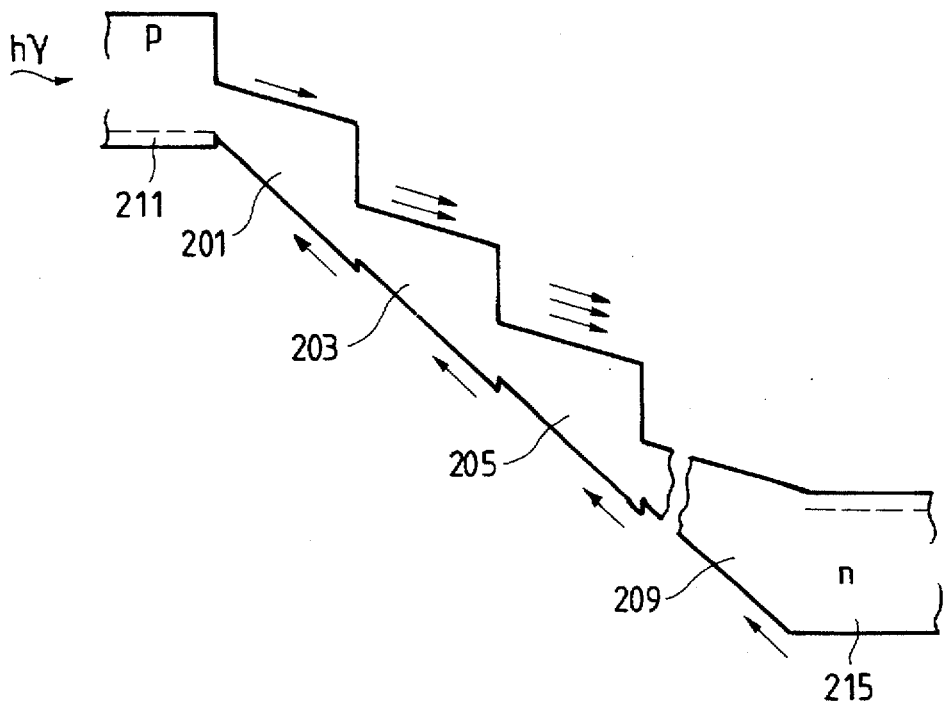
FIG. 2C is an energy band chart of said APD which is biased for carrier multiplication.

The foregoing objects can be attained, according to the present invention, by a photoelectric converting device with a photoelectric converting part which consists of a light absorbing layer of a predetermined forbidden band width Eg1 and a carrier multiplying layer positioned in laminate structure between charge injection blocking layers and in which said multiplying layer is composed of a layer or plural layers with a stepback structure of the forbidden band width having a minimum width Eg2 and a maximum width Eg3 in alternate manner and showing a continuous variation of said width between said minimum and maximum widths in each layer, wherein said charge injection blocking layers, light absorbing layer and carrier multiplying layer are composed of non-monocrystalline semiconductors and at least the layer or layers having said minimum forbidden band width Eg2 contain a microcrystalline structure.

Also the foregoing objects can be attained by a photoelectric converting device with a photoelectric converting part which consists of a light absorbing layer of a predetermined forbidden band width Eg1 and a carrier multiplying layer positioned in laminate structure between charge injection blocking layers and in which said multiplying layer is composed of a layer or plural layers with a stepback structure of the forbidden band width having a minimum width Eg2 and a maximum width Eg3 in alternate manner and showing a continuous variation of said width between said minimum and maximum widths in each layer, wherein said charge injection blocking layers, light absorbing layer and carrier multiplying layer are composed of non-monocrystalline semiconductors and at least the layer or layers having said maximum forbidden band width Eg3 contain a microcrystalline structure.

Now, with reference to FIGS. 3A to 3C, there will be explained a preferred structure of the photoelectric converting device of the present invention, and the energy band structure and the function thereof.

FIG. 3A is a schematic cross-sectional view of a photoelectric converting device of the present invention, including an independent light absorbing layer 310 and plural stepback structure layers 301, 303, 305, 307, 309 constituting a multiplying layer are sandwiched between a p-semiconductor layer 311 and an n-semiconductor layer 315 constituting charge injection blocking layers. Electrodes 313, 314 are in respective electric contact with said semiconductor layers 311, 315, and the above-mentioned layers are formed on a glass substrate 316. Said charge injection blocking layer may be composed of a metal forming a Schottky junction with the adjacent semiconductor layer, and such structure naturally provides an effect same as when said layer is composed of a p-semiconductor layer. The number of stepback structure layers is not limited to five in the illustrated structure, but can be one or any plural number equal to or larger than two. FIG. 3B is a schematic energy band chart of said device in an unbiased state, and FIG. 3C is an energy band chart of said device when inversely biased. The principle of multiplication, called avalanche effect, is same as the conventional mechanism proposed by Capasso et al., but the photoelectric converting device of the present invention is characterized by the following features:

(1) As an independent light absorbing layer 310 is positioned between the stepback structure layers 301–309 and the p-semiconductor layer 311 constituting the charge injection blocking layer at the light entrance side, the intrusion of light into the multiplying layer beyond said light absorbing layer is reduced, and the fluctuation in the multiplying rate resulting from such light intrusion into the multiplying layer is therefore reduced;

(2) Since said multiplying layer is composed of a non-monocrystalline material, it is rendered easy to prepare stepback structure layers with ΔEc (for electron multiplication; ΔEv for hole multiplication) close to or larger than the threshold energy for ionization. It is therefore rendered possible to limit the location of ionization and to bring the probability of ionization close to unity, so that a sufficient amplification rate can be obtained with a low noise level;

(3) In the photoelectric converting device of the present invention, the light absorbing layer and the multiplying layers can be composed with non-monocrystalline materials which can be formed at a low temperature and are advantageous for realizing a large area. The non-monocrystalline materials mean polycrystalline or amorphous materials, and more specifically include amorphous silicon compensated with halogens (hereinafter written as a-Si(H, X)), similarly compensated amorphous silicon-germanium (hereinafter written as a-SiGe(H, X)), similarly compensated amorphous silicon carbide (hereinafter written as a S-SiC(H, X)), and polycrystalline silicon. Also the amorphous silicon includes not only those showing a halo pattern in thin film X-ray diffraction but also those showing crystallinity indicated by peaks specified by Miller indexes Si [111], [220] and [311]. Because the constituents are non-monocrystalline, the device can be easily prepared, for example by plasma CVD, at a low temperature, for example, at 200°–300° C., and on a large-sized substrate. Also relatively easy modification of the formulation enables control of the forbidden band width, thus facilitating the formation of the multiplying layer with a stepback structure. Besides a relatively film stepback structure is ensured by suppressed thermal atomic diffusion. The drawbacks related to the multi-layered structure are thus reduced. Particularly the dark current can be reduced since the charge injection blocking layers can be formed of non-monocrystalline materials, such as those of a relatively wide forbidden band width, or amorphous silicon with such crystallinity showing a high doping effect;

(4) Presence of a "microcrystalline structure" in the vicinity of a formulation varying layer with the maximum forbidden band width in the multiplying layer reduces the drift of carriers in the gap state, thereby increasing the energy obtained by the carriers in the stepback structure, thus elevating the probability of ionization of carriers and of multiplying effect, whereby an APD of a further reduced noise level can be obtained. On the other hand, if said formulation varying layer is composed of a mere amorphous material, the carriers can drift in the gap state of the band gap, the energy obtained by carriers in the stepback structure becomes smaller than ΔEc (or ΔEv). Said "microcrystalline" structure is defined as a structure in which small crystalline particles with a particle size of several ten to several hundred angstroms are dispersed in an amorphous material. The particle size can be determined for example by X-ray diffraction or Raman spectroscopy;

(5) The ionization in this device, when taking place in the vicinity of the formulation varying layer with the minimum forbidden band width in the multiplying layers, where said "microcrystalline structure" is present, occurs in the microcrystalline particles in a comparable level as in the bulk crystalline material, whereby the probability of ionization of carriers is increased, leading to a securer multiplying effect. Thus there can be realized an APD of a further reduced noise level. On the other hand, if said formulation varying layer is composed of a mere amorphous material, and band gap will include many gap states, inducing scattering by so-called "defects". Thus the carriers tend to lose the energy and become unable to utilizing the energy, obtained in the stepback structure, for ionization, so that the ionization rate will not be improved;

(6) The light absorbing layer, selectable from a wide range of materials, can be composed of a material with a high light absorption coefficient, such as hydrogenated amorphous silicon (a-Si:H), so that the entire device as well as said absorbing layer can be made thinner; and (7) As the forbidden band width of the light absorbing layer has a larger freedom for the same reason as in the item (4), there can be obtained the photoelectric converting device of a high sensitivity to the light of various wavelength regions. In particular a high sensitivity in the visible spectral region can be obtained by selecting the forbidden band width Eg1 of the light absorbing layer 310 corresponding to the visible spectral region.

[Embodiment 1]

Figure 4:
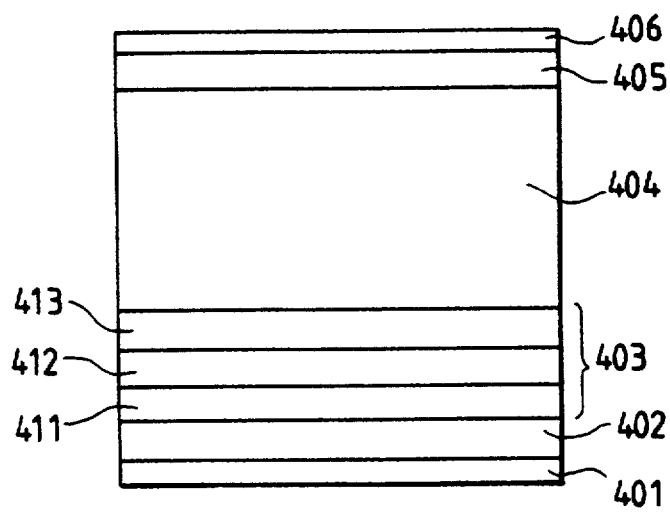
FIG. 4 is a schematic cross-sectional view of an embodiment of the photoelectric converting device of the present invention.
Figure 2A:
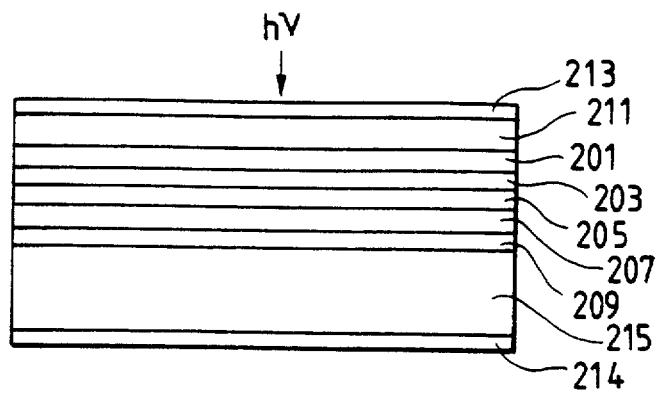
Figure 2B:
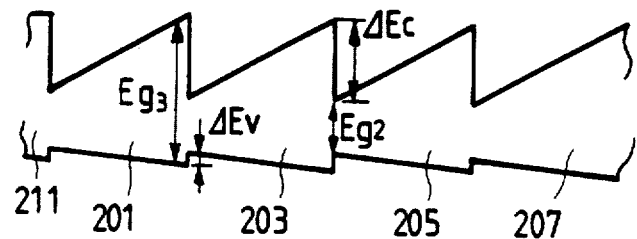
Figure 2C:
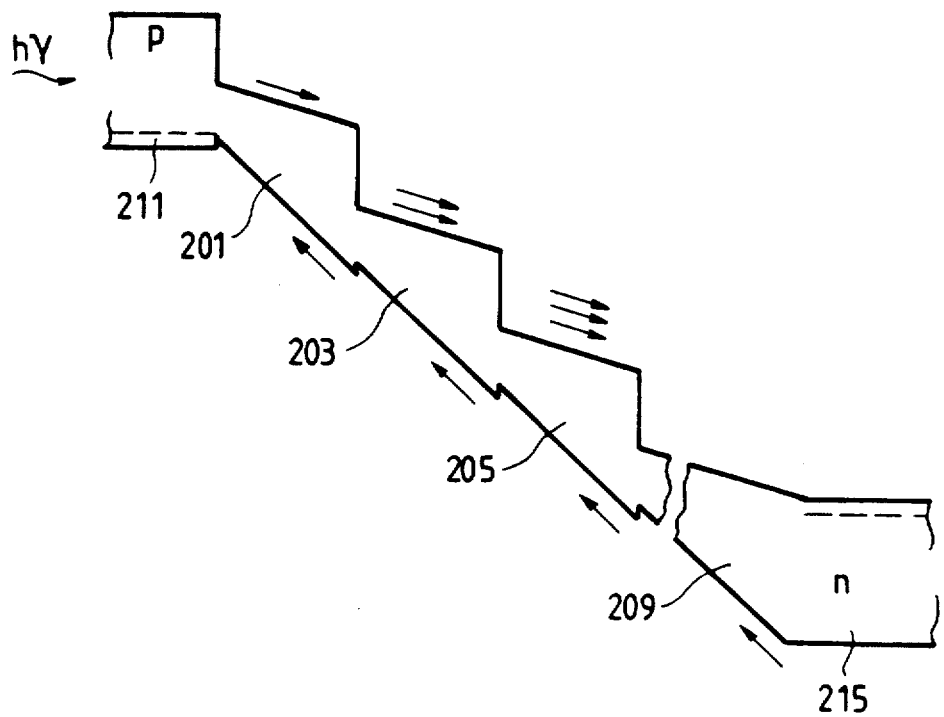

The following is a specific embodiment of the photoelectric converting device of the present invention, with reference to FIG. 4.

In FIG. 4 there are shown a Cr electrode 401; a charge injection blocking layer 402 of n-type a-$Si_{1-x}Ge_x$:H of a thickness of ca. 500 Å for blocking positive hole injection; a multiplication area 403 with varying formulation a-$Si_{1-x}Ge_x$:H a-$Si_{1-y}C_y$:H, containing microcrystalline structure, for carrier multiplication; a light absorbing layer 404 of a-Si:H of a thickness of ca. 1 µm for generating carriers by light absorption; a charge injection blocking layer 405 of p-type a-$Si_{1-y}C_y$:H of a thickness of ca. 100 Å for blocking electron injection; and a transparent electrode 406 principally composed of indium oxide.

The Cr electrode 401 and the transparent electrode 406 are formed by electron beam evaporation, while the charge injection blocking layer 402, the multiplication area 403, the light absorbing layer 404 and the charge injection blocking layer 405, all being amorphous, are formed by plasma CVD. The raw material gases for amorphous layer formation are $SiH_4$, $GeH_4$, $PH_3$ and $H_2$ for the charge injection blocking layer 402; $SiH_4$, $GeH_4$, $CH_4$ and $H_2$ for the multiplication area 403; $SiH_4$, $CH_4$ and $H_2$ for the light absorbing layer 404; and $SiH_4$, $CH_4$, $B_2H_6$ and $H_2$ for the charge injection blocking layer 405.

The multiplication area 403 consists of three formulation varying layers 411, 412, 413 of a thickness of 200 Å each, in which the gas flow rates of $CH_4$ and $GeH_4$ are continuously varied.

Figure 5A:
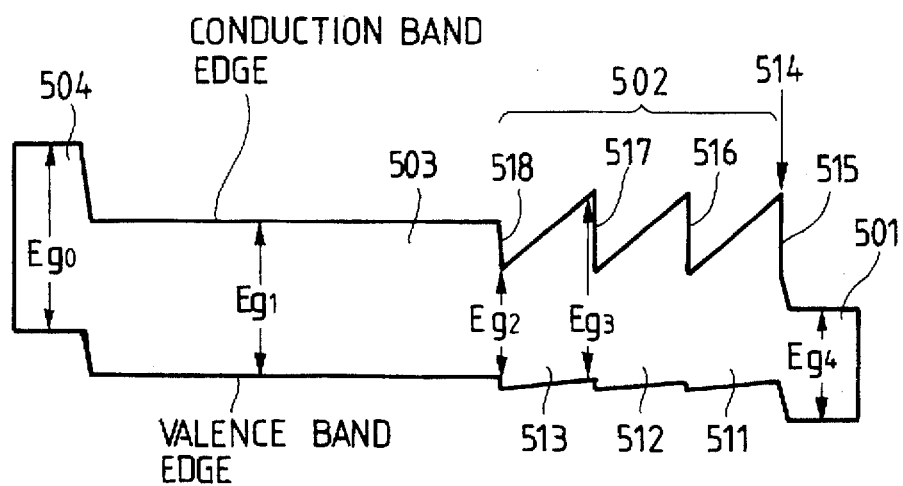
FIG. 5A is an energy band chart of said device in an unbiased state.
Figure 5B:
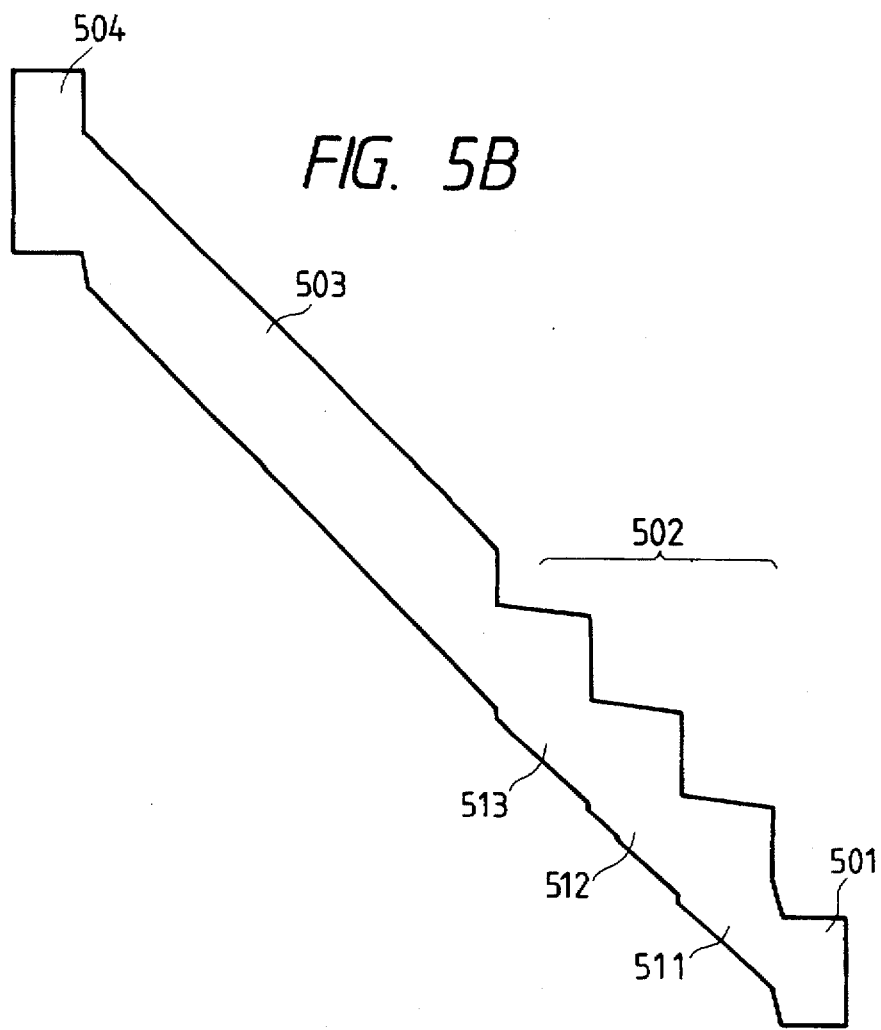
FIG. 5B is an energy band chart of said device in a based state for carrier multiplication.

The photoelectric converting device shown in FIG. 4 will ideally have an energy band structure shown in FIGS. 5A and 5B, respectively in an unbiased state and in a biased state for carrier multiplication.

FIGS. 5A and 5B indicate that the forbidden band width is Eg4 in the layer 501; Eg2 as the minimum value and Eg3 as the maximum value in the multiplication area 502 consisting of the formulation varying layers 511, 512, 513; and Eg0 in the layer 504.

In the unbiased state shown in FIG. 5A, the energy level shows discontinuities at the conduction band edge and the valence band edge, but in the biased state shown in FIG. 5B, there are scarcely present barriers by energy discontinuities in the direction of drift of carriers.

The forbidden band width Eg1 of the a-Si:H layer 503 is ca. 1.72 eV.

Also the a-$Si_{1-y}C_y$:H layer 504, with a formulation y= ca. 0.4, has a forbidden band width Eg0 equal to ca. 2.3 eV. Also in the layers 511, 512, 513, the maximum forbidden band width Eg3 given by a-$Si_{1-y}C_y$:H is ca. 2.3 eV.

Also the a-$Si_{1-y}Ge_x$:H layer 501, with a formulation x=ca. 0.6, has a forbidden band width Eg4 equal to ca. 1.3 eV. In said layers 511, 512, 513, the minimum forbidden band width Eg2 given by a-$Si_{1-x}Ge_x$:H is ca. 1.5 eV.

The light absorbing layer 503 has optical absorption coefficients of ca. $1\times10^5$ $cm^{-1}$ for a wavelength of 400 nm and ca. $5\times10^3$ $cm^{-1}$ for a wavelength of 700 nm, thus capable of sufficiently absorbing the visible light.

The above-explained device showed an amplification factor of 10 times or higher under a bias application of 10 V, no change in the amplification factor for a change in wavelength in the visible spectral region from 700 nm, a leak current as low as less than 1 nA/$cm^2$ in the dark under a bias application of 10 V, and a high response speed comparable to that in a PIN photoelectric converting device without the multiplication layer 502.

Although the above-explained embodiment has three formulation varying layers in the multiplication area, the number of said layers may be arbitrarily selected according to the desired multiplication factor.

Also said embodiment assumes a steeply varying stepback structure as an ideal energy band structure, but the same effect can be obtained even if the stepback structure has a gradual change within the average free stroke of electrons. Furthermore, a gradual change of the stepback structure is acceptable within a range providing an expected effect.

The thickness of the formulation varying layer, which is about 200 Å in the present embodiment, may be arbitrarily selected within a range of drift of carriers without recombination, though is preferably made smaller as the applied bias can be made smaller. Also the thickness of the light absorbing layer, which is about 1 µm in the present embodiment, may be so determined, according to the optical absorption coefficient, that the incident light does not reach the multiplication area through said absorbing layer.

Among the raw material gases $SiH_4$, $B_2H_6$, $PH_3$, $CH_4$ and $GeH_4$ employed for forming the amorphous layers in the present embodiment, $SiH_4$ may be replaced by a linear silane such as $SiF_4$, $Si_2H_6$, $Si_2F_6$, $Si_3H_8$, $SiH_3F$ or $Si_2F_2$, or a cyclic silane such as $Si_5H_{10}$, $Si_6H_{12}$ or $Si_4H_8$; $B_2H_6$ may be replaced by gas containing an element of group III of the periodic table, such as B (boron), Al (aluminum), In (indium) or Tl (thallium); $PH_3$ may be replaced by gas containing an element of group IV of the periodic table such as P (phosphorous), As (arsenic), Sb (antimony) or Bi (bismuth); $CH_4$ may be replaced by a carbon compound such as $CH_2F_2$, $C_2H_6$, $C_2H_4$, $C_2H_2$, $Si(CH_3)_4$ or $SiH(CH_3)_3$, a nitrogen compound such as $N_2$, $NH_3$, $H_2NNH_2$, $HN_3NH_4N_3$, $F_3N$ or $F_4N$, or an oxygen compound such as $O_2$, $CO_2$, $NO$, $NO_2$, $N_2O$, $O_3$, $N_2O_3$, $N_2O_4$ or $NO_3$; and $GeH_4$ may be replaced by a germanium compound such as $GeF_4$ or a tin compound such as $SnH_4$. Also the composition ratio of the composition varying layers is preferably in a range of 0 to ca. 0.6, for reducing the local energy levels. Also the amorphous layers may be prepared, instead of plasma CVD, by ECR plasma.

Furthermore, the amorphous semiconductor layers of the present embodiment may be replaced by non-monocrystalline layers such as polycrystalline layers.

Furthermore, the present embodiment receives the light through the p-type charge injection blocking layer and effects multiplication by electrons, but it is also possible to receive the light through the n-type charge injection blocking layer and to effect multiplication with the positive holes, by interchanging the p- and n-type blocking layers and forming a stepback structure at the valence bad side in the multiplication area.

Also the forbidden band width and the amount of doping in the p- and n-type charge injection blocking layers need only to be so adjusted as to suppress the injection of minority carriers from the electrode and not to hinder the drift of majority carriers.

[Embodiment 2]

The following is an embodiment in which the photoelectric converting device of the foregoing embodiment is laminated on scanning and readout circuits proposed by the present inventors in the U.S. Pat. No. 4,962,412.

Figure 6A:
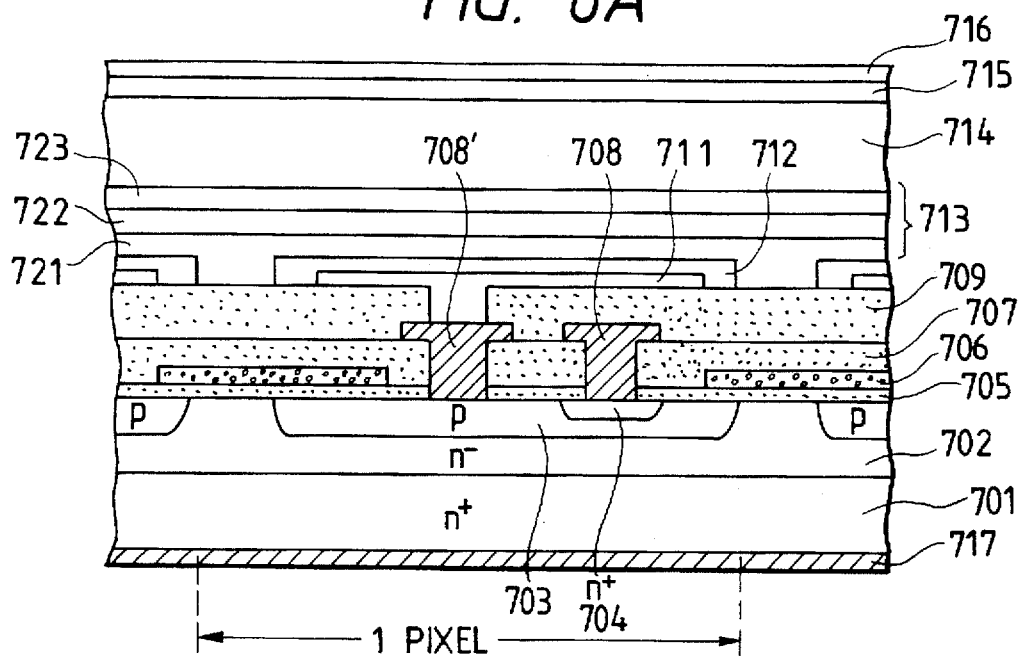
FIG. 6A is schematic cross-sectional view in the vicinity of a light-receiving area in an embodiment of the device.
Figure 6B:
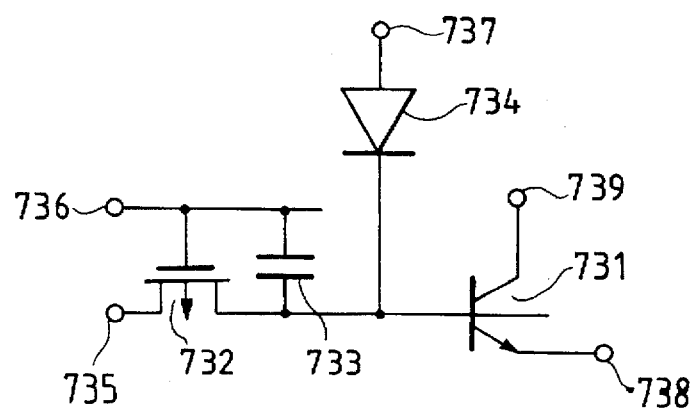
FIG. 6B is an equivalent circuit diagram of a pixel.
Figure 6C:
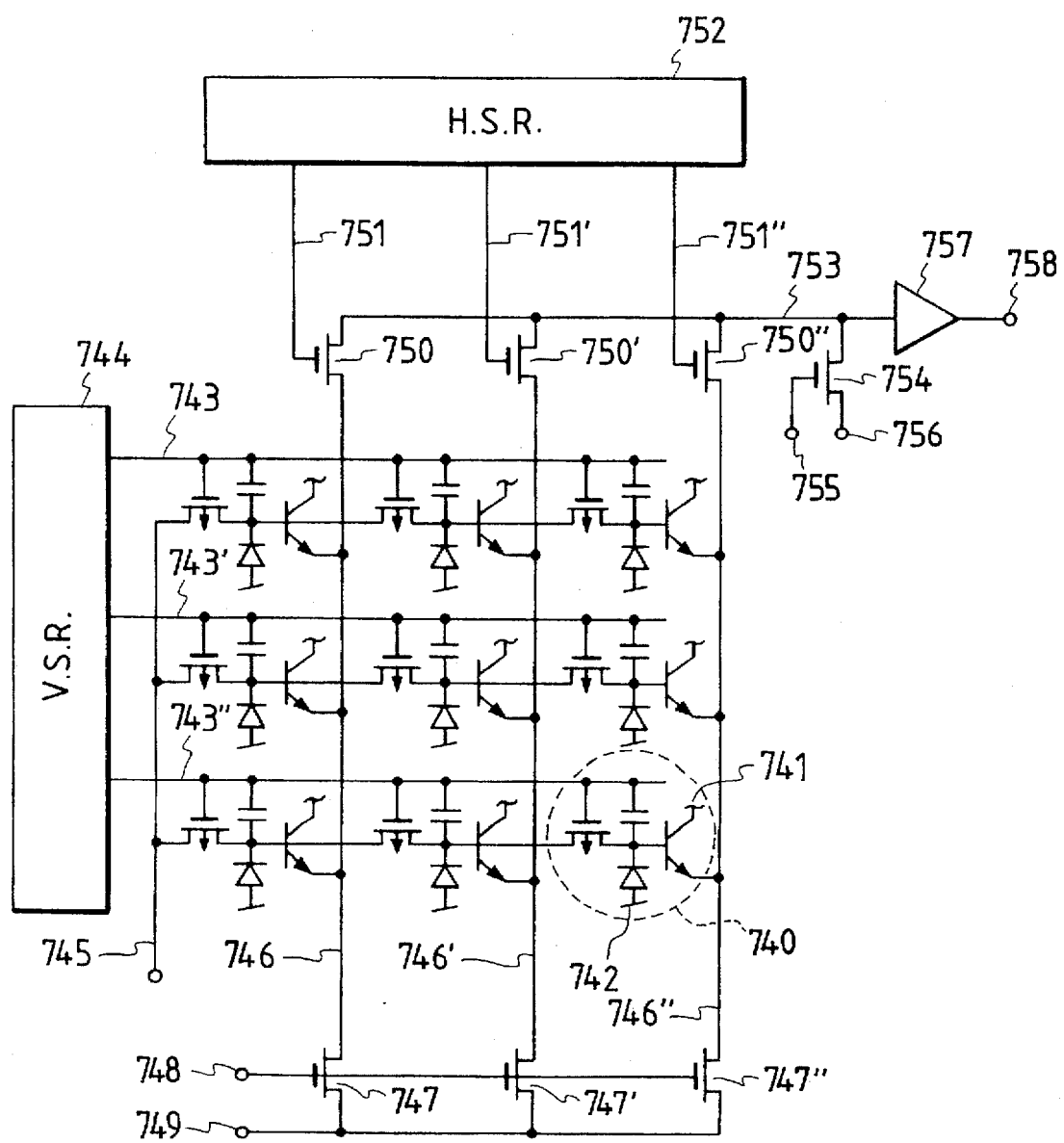
FIG. 6C is a circuit/block diagram of said embodiment.

FIG. 6A is a schematic cross-sectional view in the vicinity of a light receiving area of the present embodiment; FIG. 6B is an equivalent circuit diagram of a pixel; and FIG. 6C is an equivalent circuit/block diagram of the entire device of the present embodiment.

Referring to FIG. 6A, on an n-silicon substrate 701, there is epitaxially grown an $n^-$-collector layer 702, in which formed are a p-base area 703 and an $n^+$-emitter area 704 to constitute a bipolar transistor. The p-base area 703 is isolated from the adjacent pixel, and a gate electrode 706 is formed, on an oxide film 705, between said p-base area and that of the horizontally adjacent p-base area, thereby constituting a p-channel MOS transistor with said p-base areas serving as the source and drain areas. Said gate electrode 706 also serves as a capacitor for controlling the potential of the p-base area 703. An emitter electrode 708 and a base electrode 708' are formed after the formation of an insulation layer 707.

Subsequently an insulation layer 709 is separated for each pixel. Said electrode 711 is electrically connected with the electrode 708'. Then an n-type a-$Si_{1-x}Ge_x$:H layer is formed and separated into respective pixels.

Then a multiplication area 713 is obtained by forming composition varying layers 721, 722, 723 composed of a-$Si_{1-x}Ge_x$:H—a-$Si_{1-x}C_y$:H and containing microcrystalline structure. Subsequently formed are a light absorbing layer 714 of a-Si:H, a p-type a-$Si_{1-y}C_y$:H layer 715 and a transparent electrode 716 for applying the bias voltage to the photosensor. A collector electrode 717 is in ohmic contact with the rear face of the substrate 701.

Consequently the equivalent circuit of a pixel can be represented, as shown in FIG. 6B, by a bipolar transistor 731 composed of crystalline silicon, of which base is connected to a p-channel MOS transistor 732, a capacitor 733 and a photoelectric converting device 734 similar to that in the embodiment 1, a terminal 735 for providing the base with a potential, a terminal 736 for driving the p-MOS transistor 732 and the capacitor 733, a sensor electrode 737, an emitter electrode 738 and a collector electrode 739.

FIG. 6C is a circuit diagram of a device in which the unit pixel cell 740 shown in FIGS. 6A and 6B is arranged in a 3×3 matrix arrangement.

Each of the unit pixel cells 740 is provided with the collector electrode 741 and the sensor electrode 742. The gas electrodes of the PMOS transistors and the capacitor electrodes are commonly connected, for each row, to drive lines 743, 743', 743" which are connected to a vertical shift register (VSR) 744. Also the emitter electrodes are connected commonly, for each column, signal reading vertical lines 746, 746', 746", which are respectively connected to switches 747, 747', 747" for charge resetting in the vertical lines and to signal readout switches 750, 750', 750". The gate electrodes of said reset switches 747, 747', 747" are commonly connected to a terminal 748 for applying a vertical line resetting pulse, and the source electrodes are commonly connected to a terminal 749 for applying a vertical line resetting voltage. The gate electrodes of the readout switches 750, 750', 750" are connected, respectively through lines 751, 751', 751", to a horizontal shift register (HSR) 752, and the drain electrodes are connected through a horizontal readout line 753, to an output amplifier 757. Said horizontal readout line 753 is also connected to a switch 754, for resetting the charge in the horizontal readout line, which is in turn connected to a terminal 755 for applying a horizontal line resetting pulse and a terminal 756 for applying a horizontal line resetting voltage. The output of the amplifier 757 is taken out from a terminal 758.

In the following, the function of the device of the present embodiment will be briefly explained with reference to FIGS. 6A to 6C. The light absorbing layer 714 shown in FIG. 6A absorbs the incident light, and the generated carriers are multiplied in the multiplication area 713 and accumulated in the base area 703. When a drive pulse is supplied from the vertical shift register, in FIG. 6C, to the drive line 743, the base potential is elevated through the capacitor, whereby the signal charges of the pixels of the first row, corresponding to the amounts of incident light, are taken out to the vertical lines 746, 746', 746".

Then the horizontal shift register 752 supplies the lines 751, 751', 751" with scanning pulses in succession, thereby turning on the switches 750, 750', 750" in succession whereby the signals are released to the output terminal 758 through the amplifier 757. During this operation, the reset switch 754 is turned on between the successive onstates of the switches 750, 750', 750" to eliminate the charge remaining in the horizontal line 753.

Then the vertical line reset switches 747, 747', 747" are turned on to eliminate the remaining charges in the vertical lines 746, 746', 746". Subsequently the vertical shift register 744 applies a negative pulse to the drive line 743, thereby turning on the PMOS transistors in the pixels of the first row, thereby eliminating the remaining charges in the bases of said pixels.

Then the vertical shift register 744 sends a drive pulse to the drive line 743' whereby the signal charges of the pixels of the second row are taken out in a similar manner. Subsequently the signal charges of the third row are taken out in a similar manner.

The function of the present device is achieved by the repetition of the above-explained operations.

Though the above-explained embodiment employs a circuit structure proposed by the present inventors, the device of the present invention may be applied to the already known circuits of photoelectric converting device, as will be explained later.

[Embodiment 3]

Another preferred embodiment of the photoelectric converting device of the present invention, with reference to FIGS. 4, 5A and 5B is provided. The present embodiment contains a microcrystalline structure in the layers of maximum forbidden band width.

An a-Si:H layer 503 has a forbidden band width Eg1 of ca. 1.72 eV. An a-$Si_{1-y}C_y$:H layer 504, having a C composition ratio y=ca. 0.4, has a forbidden band width Eg0 of ca. 2.3 eV. In formulation varying layers 511, 512, 513, a maximum forbidden band width Eg3, given by a-$Si_{1-y}C_y$:H, is ca. 2.5 eV. Also an a-$Si_{1-x}Ge_x$:H layer 501, with a Ge ratio of ca. 0.6, has a forbidden band width Eg4 of ca. 1.3 eV. Among said layers 511, 512, 513, a minimum forbidden band width Eg2, also given by a-$Si_{1-x}Ge_x$:H, is ca. 1.3 eV. A light absorbing layer 503 has optical absorption coefficients of ca. $1\times10^5$ cm$^{-1}$ for a wavelength of 400 nm and ca. $5\times10^3$ cm$^{-1}$ for a wavelength of 700 nm, thus capable of sufficient light absorption in the visible spectral region.

The above-explained device of the present embodiment showed a multiplication factor of at least 10 times under a bias application 10 V, no variation in the multiplication factor even for a variation in the wavelength in the visible region from a wavelength of 700 nm, a leak current as low as less than 1 nA/cm$^2$ in the dark, under a bias application of 10 V, and a fast response speed comparable to that of a PIN photoelectric converting device without the multiplication layer 502.

Although the above-explained embodiment has three formulation varying layers in the multiplication area, the number of said layers may be arbitrarily selected according to the desired multiplication factor. Also said embodiment assumes a steeply varying stepback structure as an ideal energy band structure, but a same effect can be obtained even if the stepback structure has a gradual change within the average free stroke of electrons. Furthermore, a gradual change of the stepback structure is acceptable within a range which provided an expected effect.

The thickness of the formulation varying layer, which is about 200 Å in the present embodiment, may be arbitrarily selected within a range of drift of carriers without recombination, through is preferably made smaller as the applied bias is made smaller. Also the thickness of the light absorbing layer, which is about 1 µm in the present embodiment, may be so determined, according to the optical absorption coefficient, that the incident light does not reach the multiplication area through said absorbing layer.

Among the raw material gases $SiH_4$, $B_2H_6$, $PH_3$, $CH_4$ and $GeH_4$ employed for forming the amorphous layers in the present embodiment, $SiH_4$ may be replaced by a linear silane such as $SiF_4$, $Si_2H_6$, $Si_2F_6$, $Si_3H_8$, $SiH_3F$ or $Si_2F_2$, or a cyclic silane such as $Si_5H_{10}$, $Si_6H_{12}$ or $Si_4H_8$; $B_2H_6$ may be replaced by gas containing an element of group III of the periodic table, such as B (boron), Al (aluminum), In (indium) or Tl (thallium); $PH_3$ may be replaced by gas containing an element of group IV of the periodic table such as P (phosphorous), As (arsenic), Sb (antimony) or Bi (bismuth); $CH_4$ may be replaced by a carbon compound such as $CH_2F_2$, $C_2H_6$, $C_2H_4$, $C_2H_2$, $Si(CH_3)_4$ or $SiH(CH_3)_3$, a nitrogen compound such as $N_2$, $NH_3$, $H_2NNH_2$, $HN_3NH_4N_3$, $F_3N$ or $F_4N$, or an oxygen compound such as $O_2$, $CO_2$, $NO$, $NO_2$, $N_2O$, $O_3$, $N_2O_3$, $N_2O_4$ or $NO_3$; and $GeH_4$ may be replaced by a germanium compound such as $GeF_4$ or a tin compound such as $SnH_4$. Also the composition ratio of the composition varying layers is preferably in a range of 0 to ca. 0.6, for reducing the local energy levels. Also the amorphous layers may be prepared, instead of plasma CVD, by ECR plasma. Furthermore, the amorphous semiconductor layers of the present embodiment may be replaced by non-monocrystalline layers such as polycrystalline layers.

Also the present embodiment receives the light through the p-type charge injection blocking layer and effects multiplication by electrons, but it is also possible to receive the light through the n-type charge injection blocking layer and to effect multiplication with the positive holes, by interchanging the p- and n-type blocking layers and forming a stepback structure at the valence band side in the multiplication area.

Furthermore, the forbidden band width and the amount of doping in the p- and n-type charge injection blocking layers need only to be so adjusted as to suppress the injection of minority carriers from the electrode and not to hinder the drift of majority carriers.

[Embodiment 4]

In this embodiment, the photoelectric converting device of the embodiment 3 is provided on scanning/readout circuits in a similar manner as in the embodiment 2.

Though this embodiment employs a circuit proposed by the present inventors, it is also possible to apply the already known circuits of photoelectric converting device.

[Embodiment 5]

In the following there will be explained a case of employing the photoelectric converting device of the present invention in a photoelectric converting device of the ordinary structure. FIG. 7 is a block diagram employing the present invention in a photoelectric converting device of an ordinary structure, wherein a photoelectric converting unit 801 of the present invention, consisting for example of the device shown in embodiments 1 to 4, is connected to a signal output unit 805. Said signal output unit 805 includes accumulation means 802 for the signals released from the photoelectric converting unit 801, scanning means 803 for scanning said signals; and readout means 804 consisting for example of an amplifying circuit, a noise compensating circuit etc. for the signals transferred from the scanning means 803. The accumulation means 802 may be dispensed with unless an accumulating operation is required. There are further provided memory means 806, a controller 807 for image processing and other various controls, and an optical system 808 for entering the image information of an original document or image 809 into the photoelectric converting unit 801. The image processing apparatus may be realized in various modifications, but FIG. 7 shows, as an example, a structure with memory means 806 composed for example of a magnetic tape, a magnetic disk, a magnetooptical disk, an optical disk or a semiconductor memory.

As explained in the foregoing, the present invention provides a photoelectric converting device with a photoelectric converting part which consists of a light absorbing layer of a predetermined forbidden band width Eg1 and a carrier multiplying layer positioned in laminate structure between charge injection blocking layers and in which said multiplying layer is composed of a layer or plural layers with a stepback structure of the forbidden band width having a minimum width Eg2 and a maximum width Eg3 in alternate manner and showing a continuous variation of said width between said minimum and maximum widths in each layer, wherein said charge injection blocking layers, light absorbing layer and carrier multiplying layer are composed of non-monocrystalline semiconductors and at least the layer or layers having said minimum forbidden band width Eg2 contain a microcrystalline structure, thereby achieving a low noise level, a high multiplication factor, a fast response comparable to that of a photodiode without the multiplication layer, and a high sensitivity in the visible spectral region.

Also as explained in the foregoing, the present invention provides a photoelectric converting device with a photoelectric converting part which consists of a light absorbing layer of a predetermined forbidden band width Eg1 and a carrier multiplying layer positioned in laminate structure between charge injection blocking layers and in which said multiplying layer is composed of a layer or plural layers with a stepback structure of the forbidden band width having a minimum width Eg2 and a maximum width Eg3 in alternate manner and showing a continuous variation of said width between said minimum and maximum widths in each layer, wherein said charge injection blocking layers, light absorbing layer and carrier multiplying layer are composed of non-monocrystalline semiconductors and at least the layer or layers having said maximum forbidden band width Eg3 contain a microcrystalline structure, thereby achieving a low noise level, a high multiplication factor, a fast response comparable to that of a photodiode without the multiplication layer, and a high sensitivity in the visible spectral region.

Also the constituents of the photoelectric converting part in the present invention may be composed of non-monocrystalline materials containing at least Si atoms, whereby the forbidden band width can be easily controlled and the laminate structure can be formed at a low temperature, so that various drawbacks related to the laminate structure can be resolved.

The present invention is naturally subject to various modifications, within the scope and spirit of the appended claims.

For example, the microcrystalline structure may be present not only in either of the layer with the minimum or maximum forbidden band width but also in the both layers of the minimum and maximum forbidden band widths, and a further advanced effect can be obtained in such case.

What is claimed is:

1. A photoelectric converting device comprising:
   a photoelectric converting portion formed by building up a light absorbing layer with a predetermined bandgap Eg1 and a carrier multiplying layer between charge injection blocking layers, the carrier multiplying layer being composed of a plurality of layers each having a bandgap changing continuously from a minimum bandgap Eg2 to a maximum bandgap Eg3 in a layer thickness direction from one interface to the other interface and the minimum bandgap Eg2 being adjacent to the maximum bandgap Eg3 between the adjacent layers of the carrier multiplying layer, wherein the charge injection blocking layers, the light absorbing layer and the carrier multiplying layer are composed of non-monocrystalline semiconductors, and wherein at least one of all end portions having either one of the minimum bandgap Eg2 and the maximum bandgap Eg3 which are adjacent to each other has a microcrystalline structure including crystal grains of a size of several ten Å to several hundred Å, wherein said photoelectric converting portion is arranged in a matrix configuration, a shift register for scanning drive of each photoelectric converting portion is arranged in periphery of the matrix arrangement of the photoelectric converting portion.

a signal output section for receiving a signal from said photoelectric converting portion is provided, wherein said signal output section comprises means for storing a signal from said photoelectric converting portion, means for scanning said means for storing, and means for reading the signal from said photoelectric converting portion; and a controller for controlling said signal output section.

2. A device according to claim 1, wherein at least one of said charge injection blocking layers is composed of an n-type conductive layer.

3. A device according to claim 1, wherein at least one of said charge injection blocking layers is composed of a p-type conductive layer.

4. A device according to claim 1, wherein a layer with varied composition in said multiplication layer, and a layer with varied composition between said multiplication layer and said light absorbing layer are so constructed as to constitute energy barriers not hindering the drift of carriers in said layers.

5. A device according to claim 1, wherein at least one of said charge injection blocking layers is composed of a metal constituting a Schottky junction to the neighboring semiconductor layer.

6. A device according to claim 1, wherein said non-monocrystalline layers contain at least Si atoms.

7. A device according to claim 1, provided with a plurality of said photoelectric converting parts, and a signal output unit electrically connected thereto and including at least one of accumulation means for accumulating electrical signals released from said photoelectric converting parts, scanning means for scanning said electric signals and readout means for reading said electrical signals.

8. A device according to claim 1 wherein said at least layer or layers having said minimum bandgap Eg2 contain a microcrystalline structure.

9. A device according to claim 1 wherein said at least layer or layers having said maximum bandgap width Eg3 contain a microcrystalline structure.

10. An image processing apparatus comprising:

a photoelectric converting device comprising a photoelectric converting portion formed by building up a light absorbing layer with a predetermined bandgap Eg1 and a carrier multiplying layer between charge injection blocking layers, the carrier multiplying layer being composed of a plurality of layers each having a bandgap changing continuously from a minimum bandgap Eg2 to a maximum bandgap Eg3 in a layer thickness direction from one interface to the other interface and the minimum bandgap Eg2 being adjacent to the maximum bandgap Eg3 between the adjacent layers of the carrier multiplying layer, wherein the charge injection blocking layers, the light absorbing layer and the carrier multiplying layer are composed of non-monocrystalline semiconductors, and wherein at least one of all end portions having either one of the minimum bandgap Eg2 and the maximum bandgap Eg3 which are adjacent to each other has a microcrystalline structure including crystal grains of a size of several ten Å to several hundred Å;

an optical system for entering image information to said photoelectric converting portion;

wherein said photoelectric converting portion is arranged in a matrix configuration;

a shift register for scanning drive of each photoelectric converting portion is arranged in periphery of the matrix arrangement of the photoelectric converting portion;

a signal output section for receiving a signal from said photoelectric converting portion, wherein said signal output section comprises means for storing a signal from said photoelectric converting portion, means for scanning said means for storing, and means for reading the signal from said photoelectric converting portion; and a controller for controlling said signal output section.

11. An apparatus according to claim 10, further comprising memory means for storing said signals bearing image information.

12. An apparatus according to claim 11, wherein said memory means is at least one selected from magnetic tape, magnetic disk, magnetooptical disk, optical disk and semiconductor memory.

13. An apparatus according to claim 10, wherein at least one of said charge injection blocking layers is composed of an n-type conductive layer.

14. An apparatus according to claim 10, wherein at least one of said charge injection blocking layers is composed of a p-type conductive layer.

15. An apparatus according to claim 10, wherein a layer with varied composition in said multiplication layer and a layer with varied composition between said multiplication layer and said light absorbing layer are so constructed as to constitute energy barriers not hindering the drift of carriers in said layers.

16. An apparatus according to claim 10, wherein at least one of said charge injection blocking layers is composed of a metal constituting a Schottky junction to the neighboring semiconductor layer.

17. An apparatus according to claim 10, wherein said non-monocrystalline layers contain at least Si atoms.

18. An apparatus according to claim 10, provided with a plurality of said photoelectric converting parts, and further comprising a signal output unit electrically connected thereto and including at least one of accumulation means for accumulating electrical signals released from said photoelectric converting parts, scanning means for scanning said electric signals and readout means for reading said electrical signals.

19. An apparatus according to claim 10 wherein said at least layer or layers having said minimum bandgap Eg2 contain a microcrystalline structure.

20. An apparatus according to claim 10 wherein said at least layer or layers having said maximum bandgap Eg3 contain a microcrystalline structure.

* * * * *

UNITED STATES PATENT AND TRADEMARK OFFICE
CERTIFICATE OF CORRECTION

PATENT NO. : 5,744,849

DATED : April 28, 1998

INVENTOR(S) : SHIGETOSHI SUGAWA

It is certified that error appears in the above-identified patent and that said Letters Patent is hereby corrected as shown below:

IN THE DRAWINGS

Figure 1:
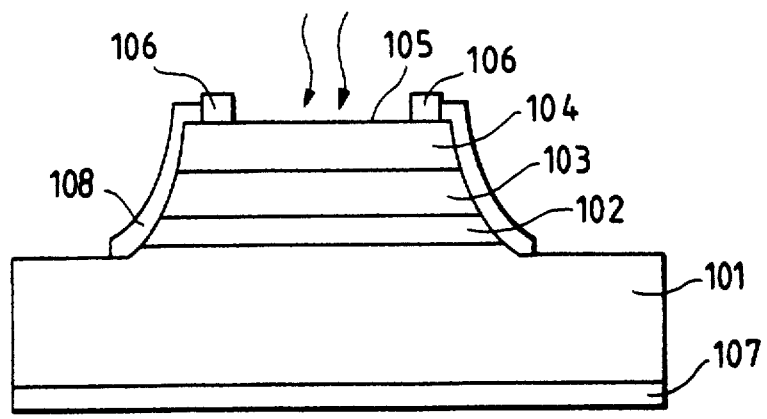
FIG. 1 is a vertical cross-sectional view of an example of APD or optical communication.

Replace sheets 1 and 2 with the attached amended Figs. 1, 4; 2A, 2B and 2C.

COLUMN 1

Line 36, "Application" should read --Applications--.

COLUMN 5

Line 6, "small" should read --small as--.

COLUMN 6

Line 22, "state" should read --state;--; and
    Line 38, "based" should read --biased--.

COLUMN 8

Line 6, "a S-SiC(H," should read --a-SiC(H,--;
    Line 19, "film" should read --thin--; and
    Line 58, "utilizing" should read --utilize--.

COLUMN 10

Line 58, "bad" should read --band--.

COLUMN 11

Line 25, "$a\text{-}Si_{1-x}C_y\text{:}H$" should read --$a\text{-}Si_{1-y}C_y\text{:}H$--.

UNITED STATES PATENT AND TRADEMARK OFFICE
CERTIFICATE OF CORRECTION

PATENT NO. : 5,744,849
DATED : April 28, 1998
INVENTOR(S) : SHIGETOSHI SUGAWA

It is certified that error appears in the above-identified patent and that said Letters Patent is hereby corrected as shown below:

COLUMN 12

Line 13, "onstates" should read --on-states--.

COLUMN 13

Line 6, "through" should read --though--.

COLUMN 15

Line 51, "electric" should read --electrical--; and
Line 57, "width" should be deleted.

COLUMN 16

Line 58, "electric" should read --electrical--.

Signed and Sealed this

Twelfth Day of January, 1999

Attest:

Attesting Officer

Acting Commissioner of Patents and Trademarks